United States Patent [19]

Inoue et al.

[11] Patent Number: 5,010,259
[45] Date of Patent: Apr. 23, 1991

[54] VOLTAGE BOOSTING CIRCUIT AND OPERATING METHOD THEREOF

[75] Inventors: Yoshinori Inoue; Masaki Kumanoya; Takahiro Komatsu; Yasuhiro Konishi; Katsumi Dosaka, all of Hyogo, Japan

[73] Assignee: Mitsubishi Denki Kabushiki Kaisha, Tokyo, Japan

[21] Appl. No.: 454,580

[22] Filed: Dec. 21, 1989

[30] Foreign Application Priority Data

Dec. 28, 1988 [JP] Japan .................. 63-332238

[51] Int. Cl.⁵ .............. H03K 4/58; H03K 19/017; H03K 17/04; H03K 19/094
[52] U.S. Cl. .................... 307/482; 307/578; 307/443; 307/450; 307/451
[58] Field of Search ............ 307/482, 578, 601, 603, 307/605, 270, 451, 585, 475, 443, 594, 592, 272.3, 450

[56] References Cited

U.S. PATENT DOCUMENTS

| | | | |
|---|---|---|---|
| 4,437,024 | 3/1984 | Wacyk | 307/594 X |
| 4,443,720 | 4/1984 | Takemae | 307/578 |
| 4,542,310 | 9/1985 | Ellis et al. | 307/585 |
| 4,554,469 | 11/1985 | Segawa et al. | 307/601 |
| 4,622,479 | 11/1986 | Taylor | 307/482 |
| 4,680,488 | 7/1987 | Okumura et al. | 307/482 |
| 4,707,625 | 11/1987 | Yanagisawa | 307/585 |
| 4,731,552 | 3/1988 | Miyamoto | 307/482 |
| 4,746,824 | 5/1988 | Magome et al. | 307/605 |
| 4,804,870 | 2/1989 | Mahmud | 307/482 |
| 4,900,950 | 2/1990 | Dubujet | 307/594 X |

FOREIGN PATENT DOCUMENTS 0069113 4/1983 Japan .................. 307/482

OTHER PUBLICATIONS

Makoto Taniguchi et al, "Fully Boosted 64K Dynamic RAM with Automatic and Self-Refresh," IEEE Journal of Solid-State Circuits, vol. SC-16, No. 5, Oct. 1981, pp. 492-498.

Primary Examiner—Stanley D. Miller
Assistant Examiner—David R. Bertelson
Attorney, Agent, or Firm—Lowe, Price, LeBlanc, Becker & Shur

[57] ABSTRACT

An input signal is inverted by a CMOS inverter and provided for an output signal line. The CMOS inverter is provided between a power supply and a ground, and its node on the side of the power supply is charged all the time to prevent the potential thereof from being lowered. An output signal provided for the output signal line is delayed by a delay circuit to be applied to a boosting capacitor. The potential of the node is further boosted by this boosting capacitor. Consequently, the potential of the output signal is also boosted. When the potential of the node is raised higher than a supply voltage, an N channel MOSFET for charging is turned off to prevent a reverse flow of a charge.

12 Claims, 9 Drawing Sheets

VOLTAGE BOOSTING CIRCUIT AND OPERATING METHOD THEREOF

BACKGROUND OF THE INVENTION

1. Field of the Invention

The present invention relates generally to voltage boosting circuits, and more particularly to an improved voltage boosting circuit for a DRAM, and to an operating method thereof.

2. Description of the Background Art

Voltage boosting circuits which generate output signals boosted to be higher than a supply voltage have been employed in semiconductor integrated circuit devices such as semiconductor memory units. For example, as shown in FIGS. 1A and 1B, in a dynamic RAM 100 using a one-transistor one-capacitor type memory cell MC formed of an information storing capacitor C and an MOS field-effect transistor Q for address selection (hereinafter referred to as MOSFET), a voltage boosting circuit 101 is provided for boosting a selected level of a word line WL, coupled to the gate of the above mentioned MOSFET Q for address selection, to a higher level than that of a supply voltage. This voltage boosting circuit 101 is provided in a word line driver WLD in FIG. 1A. The voltage boosting circuit 101 is provided in order to raise a level of the gate (word line) of the MOSFET for address selection in the above mentioned memory cell to a higher level than that of the supply voltage, and prevent a high level for writing or rewriting into a memory capacitor C from being lowered by a threshold voltage of the MOSFET Q, thereby rapidly and efficiently transmitting a signal to a data line in reading information from the memory cell MC. That is, in case that the voltage boosting circuit 101 is not provided, since a potential for writing in the memory cell MC is low in writing, a long refresh time is required. Meanwhile, since a potential for reading from the memory cell MC is low in reading, an amplification sensitivity is degraded in a sense amplifier SA, resulting in erroneous reading. Further, in reading, the low potential for reading from the memory cell MC requires a time-consuming amplification at the sense amplifier SA, resulting in a delay in access time.

Furthermore, it sometimes occurs that a voltage boosting circuit is provided in order to increase the gate voltage of an output transistor comprised in an output buffer (included in a main amplifier MA in FIG. 1A) to be higher than a supply voltage. In this case as well, the reason for providing the voltage boosting circuit is to prevent the level of the output signal from being lowered by the threshold voltage of the aforementioned output transistor, thereby rapidly and efficiently transmitting the output signal to the data output line.

FIG. 1C is a circuit diagram of an example of a conventional voltage boosting circuit disclosed in Japanese Patent Laying-Open No. 62-212997. In this figure, an N channel MOSFET 2 for precharging a node A is interposed between a power supply line 1 and the node A. The gate of the N channel MOSFET 2 is supplied with a timing signal $\phi_1$ for determining the timing of precharging. The timing signal $\phi_1$ is generated in a control circuit 102 in FIG. 1A. A P channel MOSFET 3 and an N channel MOSFET 4 being connected in series are interposed between the node A and ground 5. Respective gates of the P channel MOSFET 3 and N channel MOSFET 4 are provided with an input signal $\phi_X$. Also, the P channel MOSFET 3 has its source and substrate connected to each other to prevent latch up. The P channel MOSFET 3 and N channel MOSFET 4 constitute a so-called CMOS inverter to provide an output signal $\overline{\phi_X}$ inverted from the input signal $\phi_X$ for an output signal line 6. In addition, one electrode of a capacitor 7 is connected to the node A. This capacitor 7 is a boosting capacitor for boosting a potential of the node A, and the other electrode thereof is supplied with a timing signal $\phi_2$. This timing signal $\phi_2$ is generated in the control circuit 102 in FIG. 1A. Wiring capacitance 8 is parasitic on the output signal line 6.

FIG. 2 is a timing chart for the operation of the conventional voltage boosting circuit shown in FIG. 1C. The operation of the conventional voltage boosting circuit shown in FIG. 1C will be described hereinafter, referring to the timing chart of FIG. 2.

First of all, since the timing signal $\phi_1$ is at an "H" level in an initial state, the N channel MOSFET 2 is on and the potential of the node A is $(V_{cc} - V_{th})$. The $V_{cc}$ is a supply voltage and the $V_{th}$ is a threshold voltage of the N channel MOSFET 2. When the input signal $\phi_X$ is at the "H" level as shown in FIG. 2, the output signal $\overline{\phi_X}$ is at an "L" level. When the timing signal $\phi_1$ then goes to the "L" level, the N channel MOSFET 2 is turned off. Consequently, the node A turns to be at a floating state while being charged to $(V_{cc} - V_{th})$. When the input signal $\phi_X$ then goes to the "L" level, the P channel MOSFET 3 is turned on and the N channel MOSFET 4 is turned off, so that a charge stored in the node A is divided in capacitance into the boosting capacitor 7 (a capacitance value thereof is $C_1$) and the wiring capacitance 8 (a capacitance value thereof is $C_x$), and the potential of the node A, $(V_{cc} - V_{th})$ is lowered to the potential of V shown below.

$$C_1(V_{cc} - V_{th}) = (C_1 + C_x) \times V \quad (1)$$

$$V = \frac{C_1}{C_1 + C_x}(V_{cc} - V_{th})$$

When the timing signal $\phi_2$ goes to the "H" level, the potential of the node A is $(V + \alpha)$ and that of the output signal $\overline{\phi_X}$ is also boosted to $(V + \alpha)$ due to the capacitive coupling of the boosting capacitor 7. At this time, the N channel MOSFET 2 is turned off, so that no charge stored in the node A flows into the power source.

As the length of the output signal line 6 increases, the capacitance value $C_x$ of the wiring capacitance 8 increases in the voltage boosting circuit shown in FIG. 1. As apparently seen in the above expression (1), the larger the capacitance value $C_x$ of the wiring capacitance is, the lower the potential V of the node A is, so that the potential $(V + \alpha)$ of the boosted output signal $\overline{\phi_X}$ is also lowered. The capacitance value $C_1$ of the boosting capacitor 7 need be large in order to raise the boosting level of the output signal $\overline{\phi_X}$. However, as the degree of integration in a semiconductor integrated circuit device becomes higher, it would be much more difficult to incorporate a capacitor having such a large capacitance value within the device. Further, even if the capacitance value $C_1$ can be larger, the size of the MOSFET included in a peripheral circuit which drives the boosting capacitor 7 must be large, so that the area occupied by the peripheral circuit on a semiconductor chip is increased.

In addition, timing signals $\phi_1$ and $\phi_2$ are required for the conventional voltage boosting circuit shown in FIG. 1C, so that a circuit for producing these timing signals $\phi_1$ and $\phi_2$ need be provided in the semiconductor integrated circuit device. As a result, a problem also arose that the size of the device need be increased.

SUMMARY OF THE INVENTION

This invention was made for eliminating the problem mentioned above and aims to provide a voltage boosting circuit which requires only a minimum circuit area and is suitable for a high degree of integration.

Another object of the invention is to reduce the size of a boosting capacitor in a voltage boosting circuit.

Another object is to reduce the number of control signals applied to the input terminals of a voltage boosting circuit.

Another object of the invention is to provide, in a DRAM, a voltage boosting circuit having a boosting capacitor that is reduced in size and having a reduced number of control signals applied thereto.

Still another object is to provide an improved method of generating the boosted voltage of a DRAM wherein the size of a boosting capacitor and number of control signals required are reduced.

A voltage boosting circuit according to this invention, provided in the semiconductor integrated circuit device for generating an output signal boosted higher than a supply voltage comprises charging means provided between a power supply and a prescribed node within the voltage boosting circuit for being conductive when the potential of the prescribed node is lower than a given value, thereby charging the prescribed node, and for being non-conductive when the potential of the prescribed node is higher than a given value, thereby preventing a charge from flowing back to the power supply from the prescribed node, signal inverting means responsive to an input signal for providing an output signal inverted from the prescribed input signal to an output terminal thereof based on the potential of the prescribed node and a ground potential, delay means for delaying the output signal of the signal inverting means for a given time, and capacitor means for boosting the potential of the prescribed node responsive to the output of delay means.

According to this invention, since the prescribed node is charged all the time to prevent its potential from being lowered by the charging means, the potential of the output signal can be prevented from being lowered by wiring capacitance of an output signal line when the output signal rises. Consequently, a capacitor with a small capacitance value can be employed as boosting capacitance means, and the voltage boosting circuit is readily formed into a highly integrated semiconductor device. Furthermore, it is possible to reduce the size of a transistor in a peripheral circuit for driving the boosting capacitor means and also to reduce the circuit area thereof. According to this invention, it is unnecessary to input a timing signal externally as is for the conventional voltage boosting circuit shown in FIG. 1C because the output signal delayed by delay means is applied to the capacitor means so as to be used as a signal for boosting. As a result, a circuit which generates such a timing signal need not be provided, while a chip area can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3A:
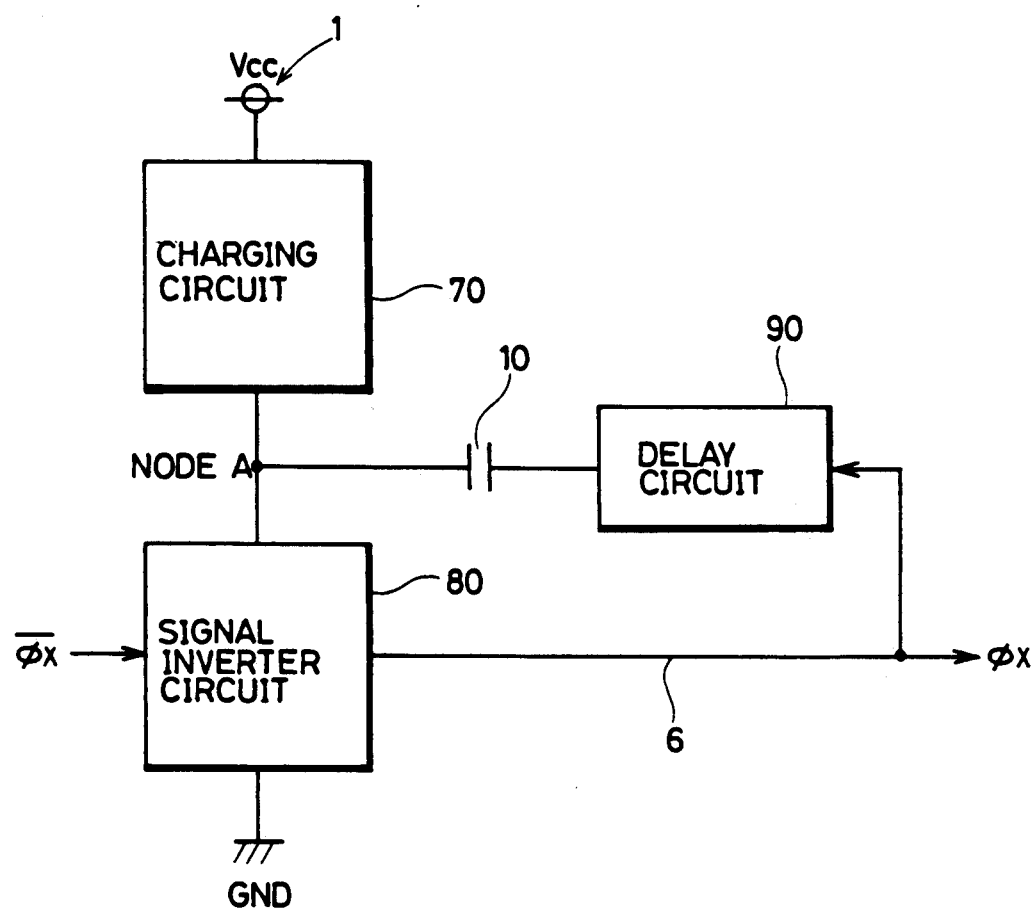
FIG. 3A is a schematic block diagram showing a configuration of one embodiment of the invention.

FIG. 3A is a schematic block diagram showing the configuration of one embodiment of the present invention. As shown in this figure, this embodiment comprises a charging circuit 70, a signal inverter circuit 80, a delay circuit 90, and a boosting capacitor 10. The charging circuit 70 is connected to a power supply line 1 to charge a node A. The signal inverter circuit 80 is connected to the node A and generates an output signal $\phi_X$ inverted from an input signal $\phi_X$ onto an output signal line 6. The delay circuit 90 delays the output signal $\phi_X$. The boosting capacitor 10 boosts the node A in response to an output signal of the delay circuit 90.

Figure 3B:
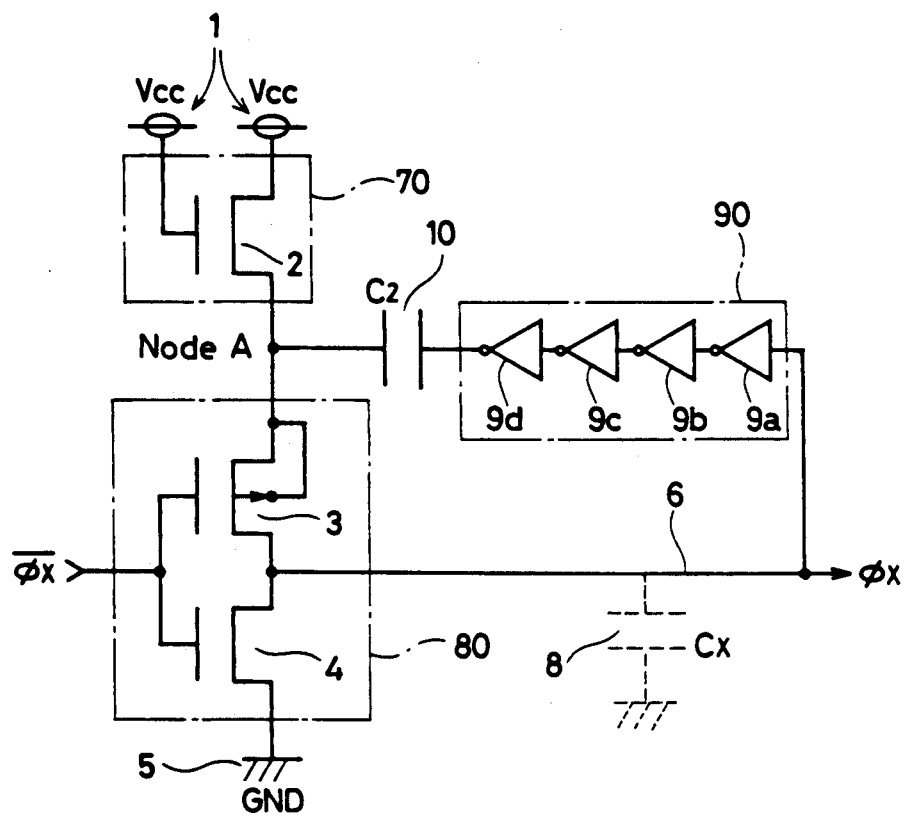
FIG. 3B is a circuit diagram of one example of a detailed configuration of the embodiment shown in FIG. 3A.
Figure 3C:
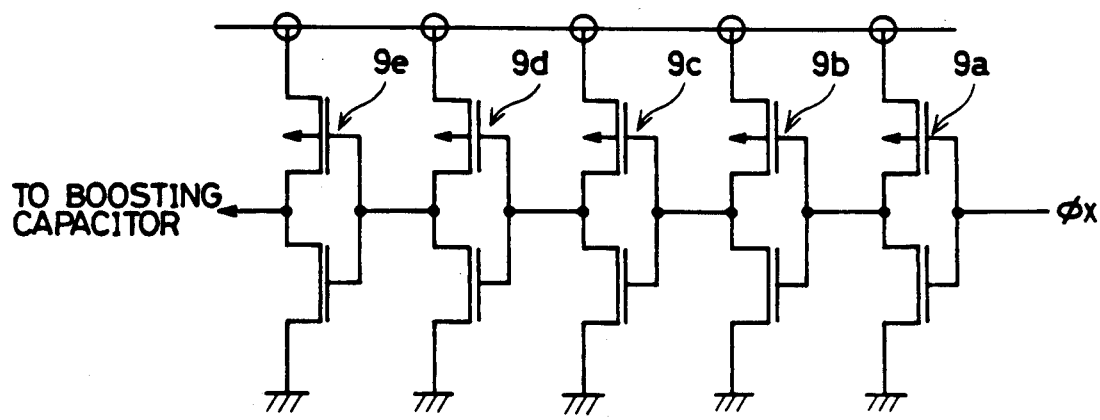
FIG. 3C is a circuit diagram of one example of a configuration of a delay circuit employed in the embodiment shown in FIG. 3B.

FIG. 3B is a circuit diagram of one example of a detailed configuration of the embodiment shown in FIG. 3A. In this figure, an N channel MOSFET 2 which is provided between the power supply line 1 and the node A has its gate connected to the power supply line 1. When the potential of the node A is lower than $(V_{cc} - V_{th})$, the N channel MOSFET 2 is switched on to charge the node A so as to prevent its potential from being lower than $(V_{cc} - V_{th})$. That is, the N channel MOSFET 2 constitutes the charging circuit 70. The output signal $\phi_X$, which is provided to the output signal line 6 from a CMOS inverter 80 as the signal inverter circuit formed of a P channel MOSFET 3 and an N channel MOSFET 4 is applied to the delay circuit 90. While the delay circuit 90 is formed of four inverters 9a–9d connected in series in the embodiment of FIG. 3B, the delay circuit 90 may be formed in other different ways. These inverters 9a–9d are, for example, constituted by CMOS inverters, as shown in FIG. 3C. The output signal $\phi_X$ delayed by the delay circuit 90 is applied to one electrode of the boosting capacitor 10. The boosting capacitor 10 has the other electrode connected to the node A. The rest of the configuration in the embodiment of FIG. 3B is the same as the configuration of the conventional voltage boosting circuit shown in FIG. 1C, and corresponding elements of FIG. 3B are denoted with the same reference numerals as those of FIG. 1C.

Figure 4:
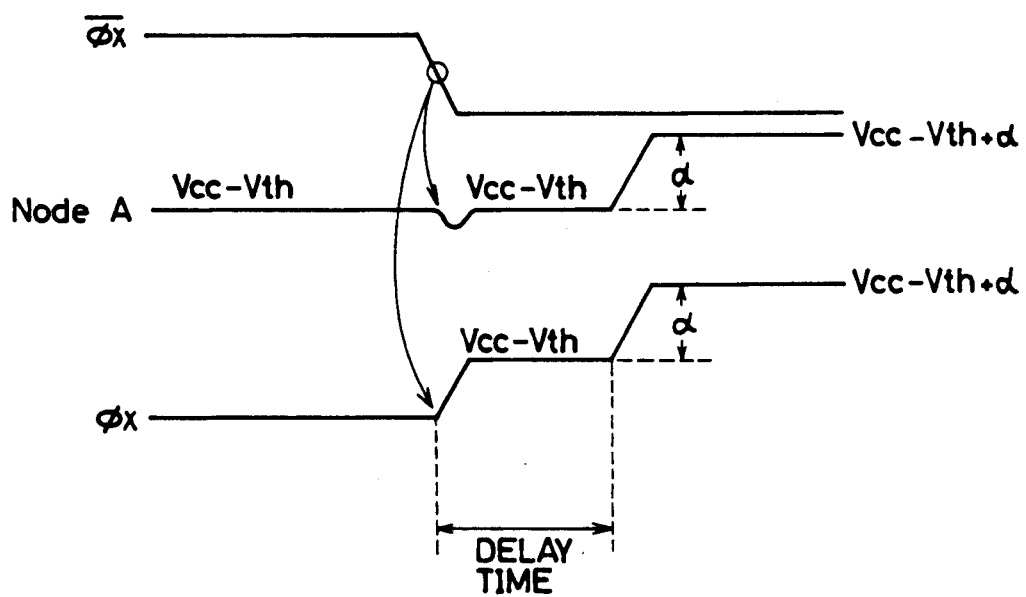
FIG. 4 is a timing chart for the operation of the embodiment shown in FIG. 3B.

FIG. 4 is a timing chart for the operation of the embodiment shown in FIG. 3B. Referring to FIG. 4, the operation of the embodiment shown in FIG. 3B will be described hereinafter.

First of all, in an initial state, the potential of the node A is retained at ($V_{cc}-V_{th}$) since the N channel MOSFET 2 is on. In addition, the input signal $\phi_X$ is at the "H" level so that the output signal $\phi_Y$ is at the "L" level. As the input signal $\phi_X$ then goes to the "L" level, the P channel MOSFET 3 is turned on and the N channel MOSFET 4 is turned off. Consequently, charging of the output signal line 6 into wiring capacitance 8 is performed, so that the potential of the node A is slightly lowered; however, when charging into the wiring capacitance 8 ends, the potential of the node A is again returned to ($V_{cc}-V_{th}$) because at this time the N channel MOSFET 2 is always on and the node A is kept charged. When the potential of the node A is returned to ($V_{cc}-V_{th}$), the potential of the output signal $\phi_Y$ is ($V_{cc}-V_{th}$). At the next stage, a delay signal of the output signal $\phi_X$ is applied to the boosting capacitor 10 by the delay circuit 90 comprising an even number (four in FIG. 3B) of inverters 9a–d. As a result, the potential of the node A rises to ($V_{cc}-V_{th}+\alpha$) due to capacitive coupling of the boosting capacitor 10, so that the potential of the output signal $\phi_Y$ is also ($V_{cc}-V_{th}+\alpha$). When the potential of the node A rises above ($V_{cc}-V_{th}$) at this time, the N channel MOSFET 2 is turned off to prevent a charge from flowing back to the power supply 1 from the node A.

Now, comparing the embodiment of FIG. 3B with the conventional voltage boosting circuit of FIG. 1C, a potential difference $\Delta V$ of the output signal $\phi_Y$ between the embodiment and the conventional voltage boosting circuit is as follows according to the described expression (1).

$$\begin{aligned}\Delta V &= (V_{cc} - V_{th}) - V \\ &= (V_{cc} - V_{th}) - \frac{C_1}{C_1 + C_x}(V_{cc} - V_{th}) \\ &= \frac{C_x}{C_1 + C_x}(V_{cc} - V_{th})\end{aligned} \quad (2)$$

Figure 1A:
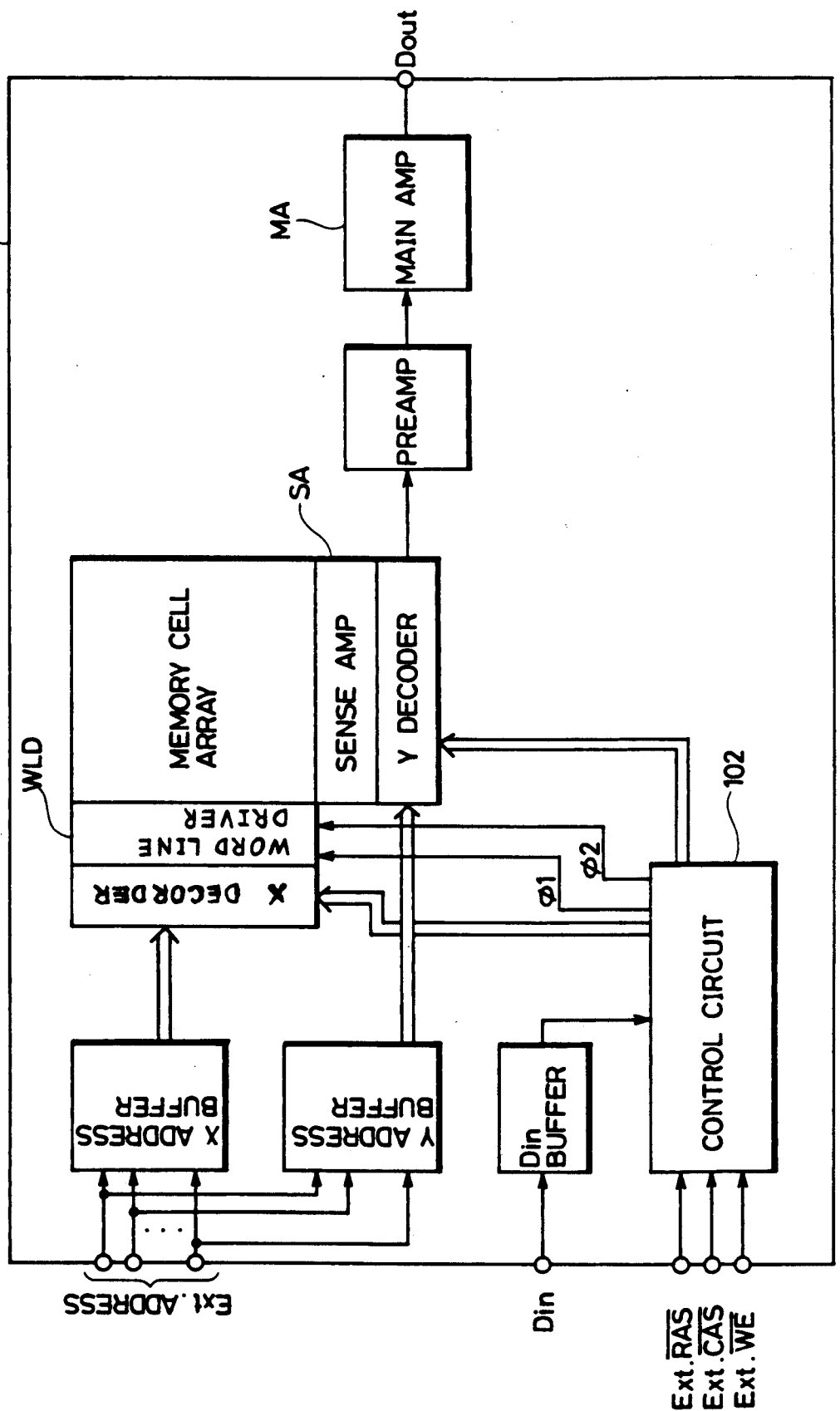
FIG. 1A is a schematic block diagram showing a general configuration of a dynamic RAM to which the invention can be applied.
Figure 1B:
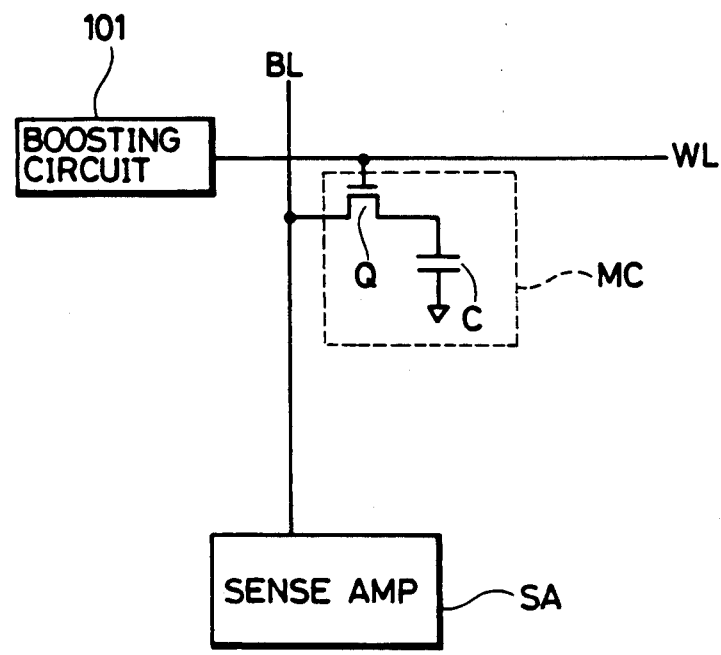
FIG. 1B is a diagram showing a relationship between a voltage boosting circuit employed as a word line driver and a peripheral circuit.
Figure 1C:
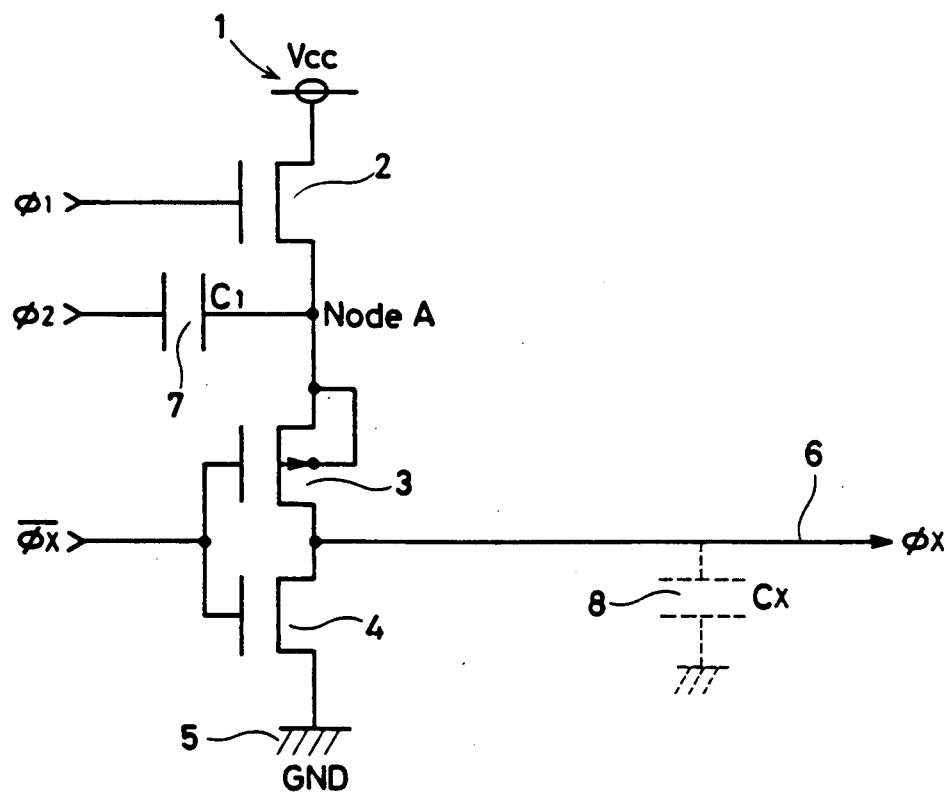
FIG. 1C is a circuit diagram of one example of a conventional voltage boosting circuit.
Figure 2:
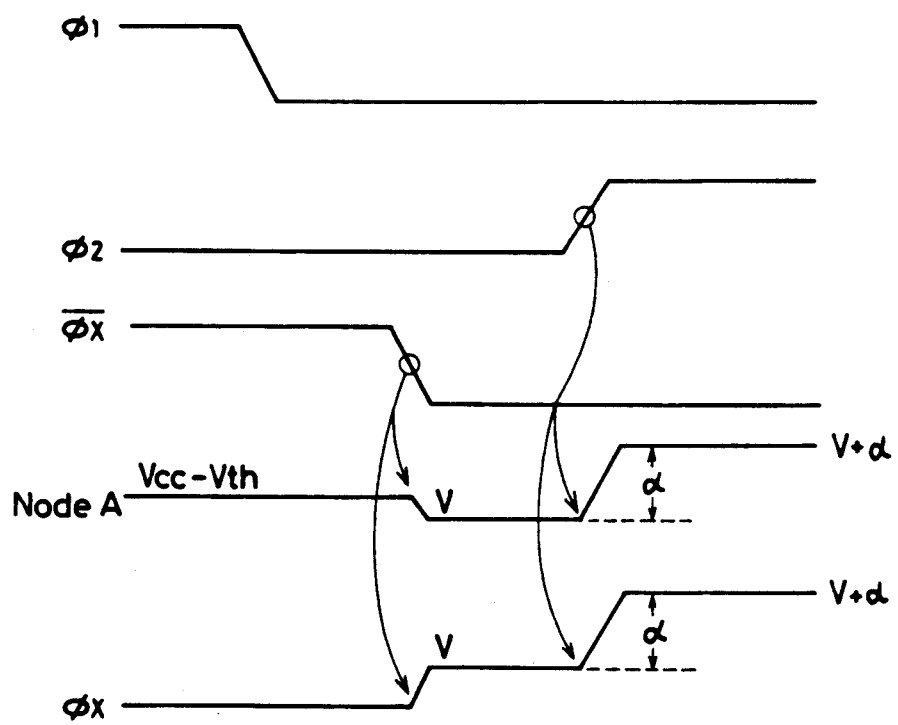
FIG. 2 is a timing chart for the operation of the conventional voltage boosting circuit shown in FIG. 1C.

As apparently seen in the above expression (2), a larger the capacitance value $C_x$ of the wiring capacitance 8 is, the larger the $\Delta V$ is, and therefore, it is found that the embodiment of FIG. 3B is more advantageous than the conventional voltage boosting circuit of FIG. 1C. That is, in the embodiment of FIG. 3B, even if the length of the output signal line 6 and the capacitance value $C_x$ of the wiring capacitance 8 both increase, the potential of the output signal $\phi_Y$ is not lowered as compared to the conventional voltage boosting circuit of FIG. 1C. Therefore, in the embodiment of FIG. 3B, the capacitance value $C_2$ of the boosting capacitor 10 can be smaller than the capacitance value $C_1$ of the boosting capacitor 7 in the conventional voltage boosting circuit shown in FIG. 1C. Consequently, the size of the MOSFET included in the peripheral circuit which drives the boosting capacitor 10 can be kept small so as to be able to reduce a chip area, and the boosting capacitor 10 can be readily incorporated in a highly integrated semiconductor device. Furthermore, since none of timing signals $\phi_1$ and $\phi_2$ used in the conventional voltage boosting circuit of FIG. 1C is employed in the embodiment of FIG. 3B, a circuit for generating such timing signals need not be provided separately so that a chip area can further be reduced. As described above, the output signal boosted higher than a supply voltage can be generated within a minimum area to be required.

Figure 3D:
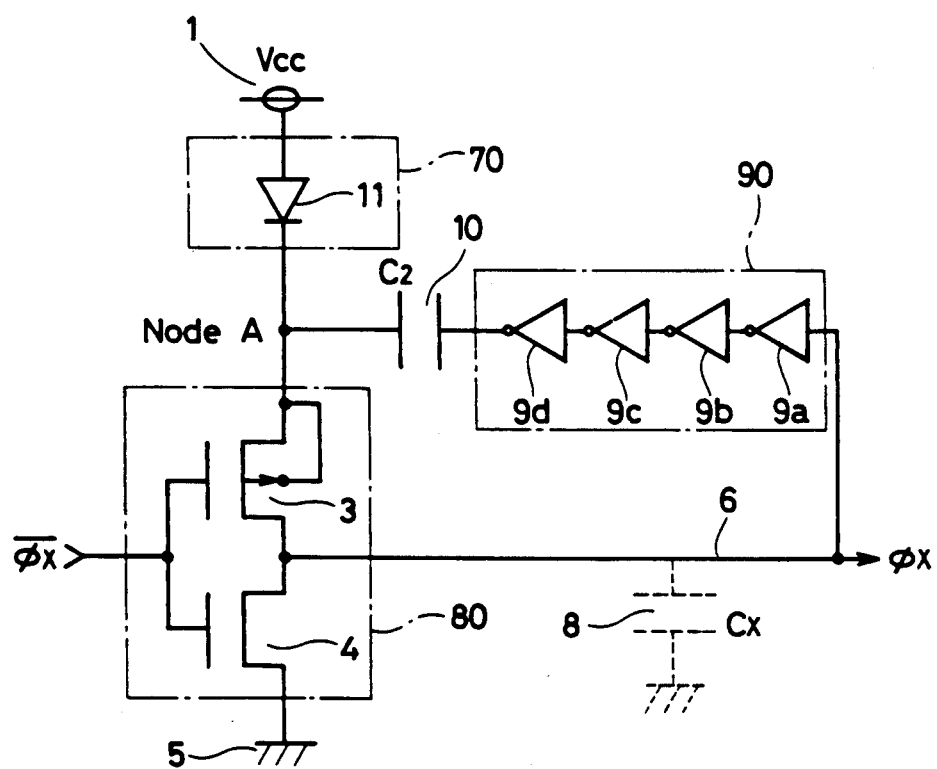
FIG. 3D is a circuit diagram of another example of the detailed configuration of the embodiment shown in FIG. 3A.

FIG. 3D is a circuit diagram showing another example of the detailed configuration of the embodiment shown in FIG. 3A. The feature of this example is that the N channel MOSFET 2 of the example of the FIG. 3B is replaced by a diode 11, and the rest of the elements in FIG. 3D are configured in the same manner as the elements of the example shown in FIG. 3B. Therefore, the elements of FIG. 3D, which are configured in the same manner as those of the example of FIG. 3B, are denoted with like reference numerals of FIG. 3B, so that those elements will not be described. The diode 11 has its anode connected to the power supply 1 and its cathode connected to the node A. The diode 11 is used as the charging circuit 70 for charging the node A. That is, when the potential of the node A is lowered below the supply voltage $V_{cc}$, the diode 11 is turned on to charge the node A and prevent the potential thereof from being lowered. When the potential of the node A is boosted higher than the supply voltage $V_{cc}$, the diode 11 is turned off to prevent a charge from flowing back to the power supply 1 from the node A. Accordingly, the diode 11 has the same function as the N channel MOSFET 2 shown in FIG. 3B in terms of a function.

Figure 5A:
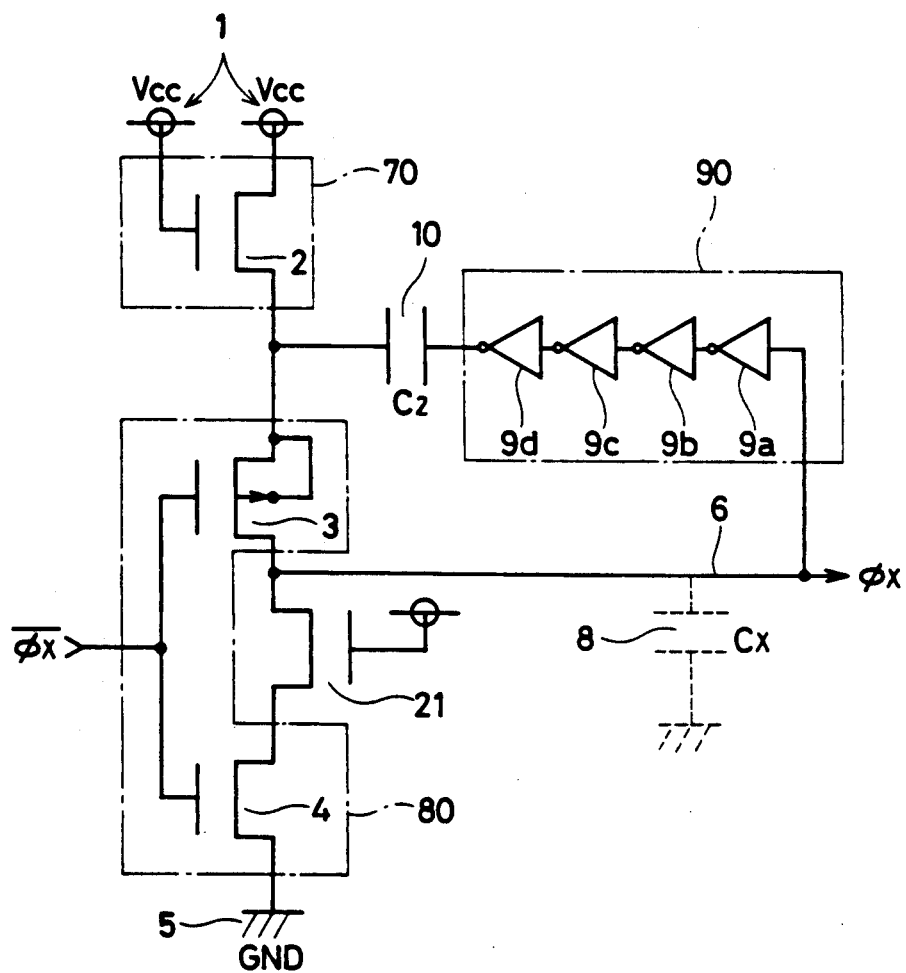
FIGS. 5A and 5B are circuit diagrams showing configurations of the other embodiments of the invention.

Several embodiments of this invention have been described heretofore. The configuration of this invention is not to be limited to those of the embodiments thereof, and various changes may be made within the scope of the main points thereof. For example, as shown in FIG. 5A, an N channel MOSFET 21 with its gate connected to the power supply 1 may be provided between the N channel MOSFET 4 and an output terminal of a CMOS inverter 80 formed of the P channel MOSFET 3 and the N channel MOSFET 4. In the embodiment of FIG. 3B or 3D, when the output signal $\phi_Y$ attains a high potential due to a boosting operation by the boosting capacitor 10, a voltage to be applied to the N channel MOSFET 4 exceeds its breakdown voltage, and thus the N channel MOSFET 4 is liable to be destroyed and a characteristic of the transistor is liable to vary due to a hot electron effect. However, a series connection of the transistor 21 between the output signal line 6 and the N channel MOSFET 4, as in the embodiment of FIG. 5A, causes a potential difference to be half reduced and thus prevents the variation in the characteristic of the transistor due to the increased breakdown voltage of the N channel MOSFET 4 and the hot electron effect.

Figure 5B:
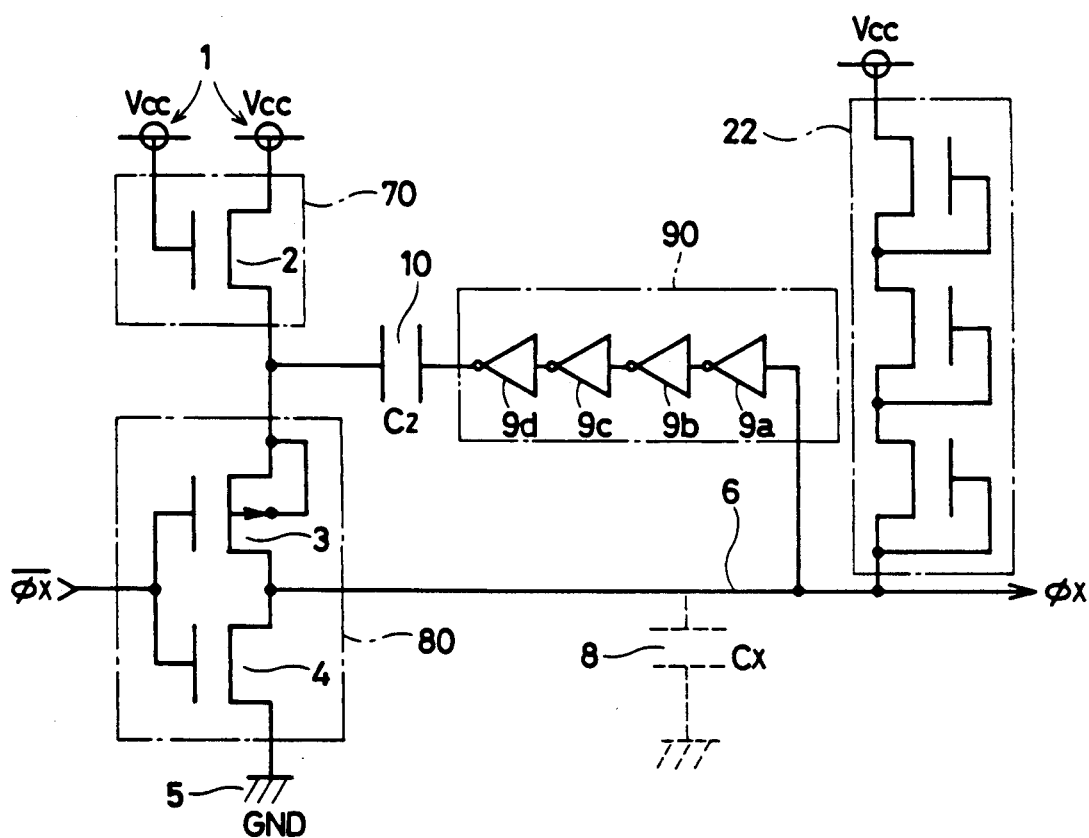

A voltage restricting circuit 22 may also be connected to the output signal line 6, as shown in FIG. 5B. In the embodiment of this figure, the potential of the output signal $\phi_Y$ can be prevented from being higher than $V_{cc}+3V_{th}$, thereby preventing a destruction of the elements.

Furthermore, the voltage boosting circuit according to this invention is most generally used for a dynamic RAM. However, the voltage boosting circuit according to this invention is applicable not only to such a semiconductor memory unit but also to various semiconductor integrated circuit devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage boosting circuit provided in a semiconductor integrated circuit device for generating at an output terminal an output signal boosted to be higher than a supply voltage, comprising:
   charging means provided between a power supply and a prescribed node in said voltage boosting circuit for being conductive when the potential of said node is lower than a given value, thereby charging said prescribed node, and being nonconductive when the potential of said prescribed node is higher than a given value, thereby preventing charge from flowing back to the power supply from said prescribed node,
   signal inverting means responsive to an input signal for providing said output signal inverted from said input signal to an output terminal thereof based on the potential of said prescribed node and a ground potential,
   delay means coupled between said output terminal and said prescribed node for delaying said output signal by a given time, and
   capacitor means responsive to the output of said delay means for boosting the potential of said prescribed node and consequently boosting said output signal.

2. A voltage boosting circuit according to claim 1, wherein said charging means comprises an N channel MOS field-effect transistor provided between the power supply and said prescribed node with its gate connected to the power supply.

3. A voltage boosting circuit according to claim 1, wherein said charging means comprises a diode having its anode connected to the power supply and its cathode to said prescribed node.

4. A voltage boosting circuit according to claim 1, wherein said signal inverting means comprises
   a P channel MOS field-effect transistor provided between said prescribed node and said output terminal for receiving said input signal at the gate thereof, and
   an N channel MOS field-effect transistor provided between said output terminal and the ground for receiving said input signal at the gate thereof.

5. A voltage boosting circuit according to claim 4, wherein said P channel MOS field-effect transistor has its source and substrate connected in common to said prescribed node.

6. A voltage boosting circuit according to claim 1, wherein said delay means comprises a plurality of inverters connected in series.

7. A voltage boosting circuit according to claim 1, wherein said semiconductor integrated circuit device comprises a semiconductor memory unit.

8. A voltage boosting circuit according to claim 7, wherein said semiconductor memory unit comprises a dynamic random access memory.

9. A voltage boosting circuit provided in a semiconductor integrated circuit for receiving an input signal and generating an output signal boosted to a value higher than that of a source of supply voltage, comprising:
   means coupled to said supply voltage source for charging a node;
   signal inverter means coupled to said node for generating on an output line an output signal inverted from said input signal; and
   feedback circuit means for feeding back said output signal as a feedback signal, said feedback circuit means including
   (a) delay means for delaying said output signal, and
   (b) coupling means responsive to said delay means for capacitively coupling said feedback signal to said node.

10. The circuit of claim 9, wherein said charging means includes unidirectional conducting means for preventing flow of current to the supply voltage source when the output voltage has a magnitude that is boosted to be greater than that of said supply voltage source.

11. A method of generating a boosted voltage that is higher than a supply voltage provided by a supply voltage source, comprising the steps of:
   receiving a binary input signal having a value that changes successively between logic high and logic low voltage levels;
   inverting said binary input signal to provide an output signal;
   from said supply voltage source, charging a node in response to the input signal and in accordance with a charge previously stored on said node;
   obtaining a feedback signal derived from said output signal;
   delaying said feedback signal by a predetermined delay time to provide a delayed feedback signal; and
   capacitively coupling said delayed feedback signal to boost said node.

12. A voltage boosting circuit provided in a semiconductor integrated circuit device for generating at an output terminal an output signal boosted to be higher than a supply voltage, comprising:
   an inverter circuit comprising at least first and second transistors in series for inverting an input signal to produce said output signal;
   a charging circuit comprising a transistor connected to said source of said supply voltage and in series with said inverter circuit, a node being established between said inverter circuit and said charging circuit, and
   a feedback circuit for feeding said output signal to said node, said feedback circuit comprising, in series,
   (a) a capacitor, and
   (b) an even number of inverter circuits forming a delay,
   said charging circuit being conductive when the potential of said node is lower than a given value, thereby charging said prescribed node, and being non-conductive when the potential of said node is higher than said given value, thereby preventing charge from flowing back to said source supply voltage from said node.

* * * * *